United States Patent [19]

Sugasawa

[11] Patent Number: 4,479,237
[45] Date of Patent: Oct. 23, 1984

[54] AUTOMATIC SOUND LEVEL CONTROL SYSTEM FOR AUDIO EQUIPMENT

[75] Inventor: Fukashi Sugasawa, Yokohama, Japan

[73] Assignee: Nissan Motor Co., Ltd., Yokohama, Japan

[21] Appl. No.: 348,257

[22] Filed: Feb. 12, 1982

[30] Foreign Application Priority Data

Feb. 18, 1981 [JP] Japan ................................ 56-22420

[51] Int. Cl.³ .............................................. H03G 1/02
[52] U.S. Cl. ...................................... 381/57; 381/107
[58] Field of Search ........... 330/149; 179/81 B, 1 HF, 179/107 R; 381/57, 94, 104, 105, 106, 107, 108, 109

[56] References Cited

U.S. PATENT DOCUMENTS 3,889,059 6/1975 Thompson et al. ............ 179/181 B
4,254,303 3/1981 Takizawa ........................... 381/107

Primary Examiner—Gene Z. Rubinson
Assistant Examiner—James L. Dwyer
Attorney, Agent, or Firm—Schwartz, Jeffery, Schwaab, Mack, Blumenthal & Koch

[57] ABSTRACT

An automatic sound level control system for audio equipment comprises means for controlling the gain of an amplifier for amplifying an audio input signal in accordance with manually selected level and the ambient noise level so that the output sound level is increased with the ambient noise level. The rate at which the sound level is increased with ambient noise is controlled high when the preset sound level selected by the listener is low, while that rate is controlled low when the preset sound level is high.

8 Claims, 2 Drawing Figures

AUTOMATIC SOUND LEVEL CONTROL SYSTEM FOR AUDIO EQUIPMENT

BACKGROUND OF THE INVENTION

The present invention relates to an automatic sound level control system which is used for varying the sound level of audio equipment in accordance with a manually selected level and the ambient noise level.

In the case of an audio system used in a relatively noisy environment, such as a radio receiver or a cassette tape player system provided in a motor vehicle, it is preferable to automatically raise the sound level of the audio system from a level preset by the listener in proportion to the increase in the level of ambient noise such as the noise generated by the engine or suspension of the motor vehicle.

SUMMARY OF THE INVENTION

An object of the inventon is to provide an automatic sound level control system for an audio equipment which is capable of varying the rate at which the sound level is increased with increasing ambient noise level.

According to the present invention, the sound level of the audio equipment is controlled in such a manner that the rate at which the sound level is increased with ambient noise level is relatively high when the preset sound level selected or determined by the listener is low, while that rate is relatively low when the preset sound level is high.

BRIEF DESCRIPTION OF THE DRAWINGS

The present invention will become better understood with reference to the accompanying drawings in which.

DETAILED DESCRIPTION OF THE PREFERRED EMBODIMENT

Figure 1:
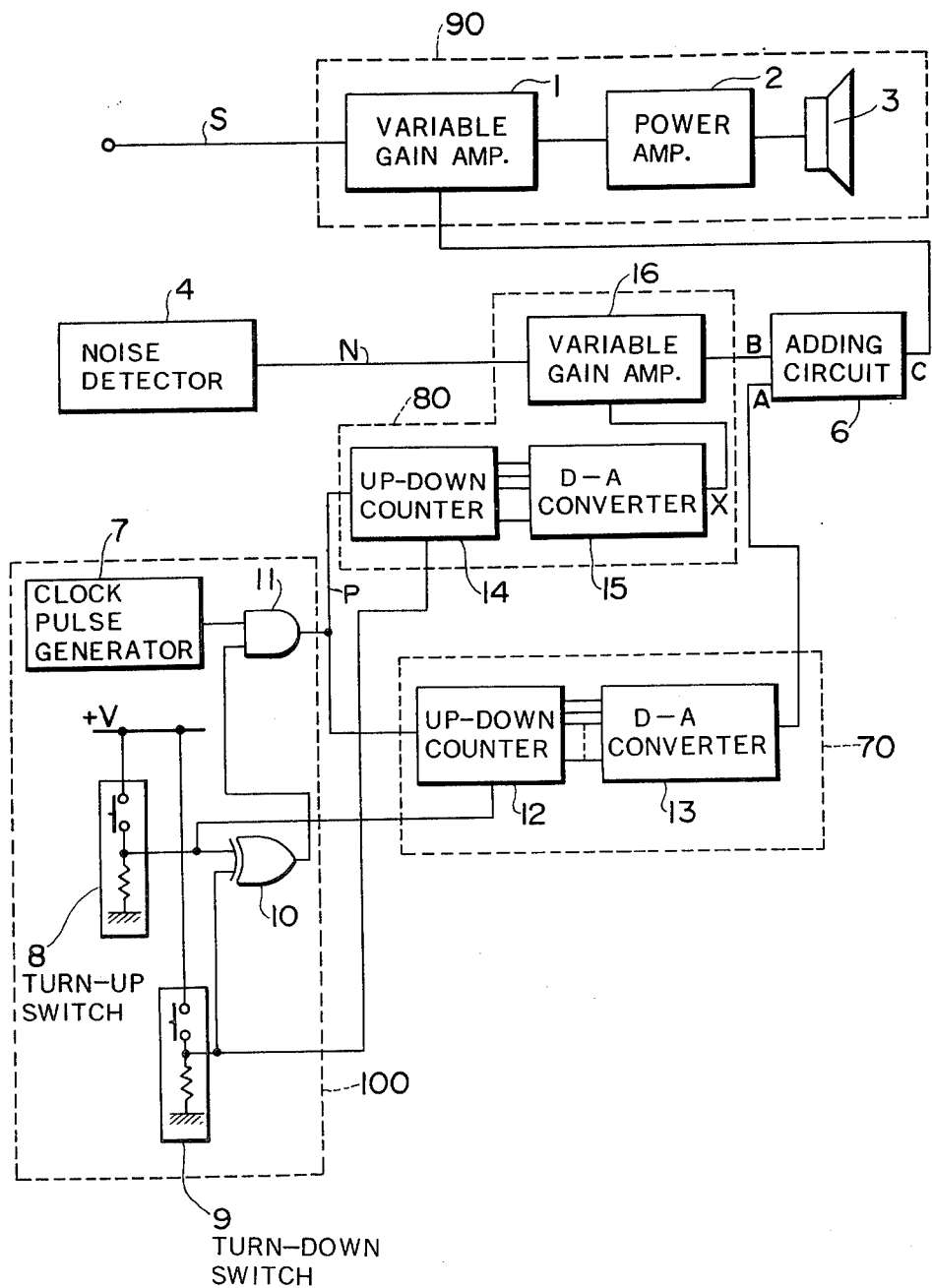
FIG. 1 is a block diagram of the automatic sound level control system according to the present invention.

Referring to FIG. 1, an embodiment of the invention is explained hereinafter.

As shown in the figure, the automatic sound level control system according to the present invention comprises a sound level adjusting unit 100 which is used for manual adjustment of the sound level by the listener, a first control signal generator 70 for generating a first control signal A indicative of the sound level determined by the listener, a second control signal generating circuit 80 for generating a second control signal B which is based on the ambient noise level and varies with the sound level determined by the listener, a noise detector 4 for supplying an ambient noise signal N into the second control signal generator 80, and an adding circuit 6 which adds the first and second control signals A and B for producing a third control signal C, and an audio output unit 90 for amplifying an audio input signal S from an appropriate signal source, such as a radio tuner or a tape deck.

The audio output unit 90 includes a variable gain amplifier 1 for receiving the audio input signal S and amplifying the same at a gain determined by the third control signal C, a power amplifier 2 which receives the output signal of the variable gain amplifier 1, and a speaker unit 3 driven by the power amplifier 2. The variable gain amplifier 1 is constructed such that the amplification factor thereof increases with the voltage level of the control signal C.

The sound level adjusting unit 100 includes a turn-up switch 8 and a turn-down switch 9 operable by the listener, an EXCLUSIVE-OR circuit 10, an AND gate 11, and a clock pulse generator 7. The turn-up switch 8 and turn-down switch 9, respectively, produce a turn-up signal Tu and a turn-down signal Td each having a predetermined voltage level, when operated by the listener of the audio system. The turn-up signal Tu and turn-down signal Td, respectively, from the turn-up switch 8 and turn-down switch 9 are applied to the EXCLUSIVE-OR circuit 10 which produces a logic "1" signal when only one of the turn-up signal Tu or the turn-down signal Td is applied to the input terminal thereof. The logic "1" output signal of the EXCLUSIVE-OR circuit 10 is applied to one of the input terminals of the AND gate 11 which also receives the clock pulse signal from the clock pulse generator 7. The AND gate 11, therefore, permits the clock pulse signal therethrough when only one of the turn-up signal Tu and turn-down signal Td is produced, i.e., when only one of the turn-up switch 8 and turn-down switch 9 is operated.

The first control signal generator 70 includes an up-down counter 12 for counting the clock pulse signal from the AND gate 11 and an D-A converter for converting the digital output signal of the up-down counter 12 into a first control signal A in the analog form. The up-down counter 12 also receives the turn-up signal Tu from the turn up switch 8 and is adapted to count up in the presence of the turn-up signal Tu and count down in the absence of the turn-up signal Tu.

The noise detector 4 may comprise a microphone disposed at an appropriate position for sensing the ambient noise and an amplifier connected thereto. The ambient noise signal N produced by the noise detector 4 is applied to the second control signal generator 80.

The second control signal generator 80 includes a variable gain amplifier 16 for producing the second control signal B by amplifying the ambient noise signal from the noise detector 4, a second up-down counter 14 for counting the clock pulse signal supplied via the AND gate 11 and a second D-A converter 15 for converting the digital output signal of the second up-down counter 14 into an analog output signal X used for controlling the gain of the variable gain amplifier 16. The variable gain amplifier 16 is so constructed that the amplification factor thereof increases with the voltage level of the signal X. The second up-down counter 14 also receives the turn-down signal Td, and is adapted to count up in the presence the turn-down signal Td and count down in the absence of the turn-down signal Td.

These up-down counters 12 and 14 are supplied with a power voltage from a back-up power supply so that the counted data is maintained therein even if the power switch is turned off.

The first and second control signals A and B from the first and second control signal generators 70 and 80, respectively, are supplied to the adding circuit 6 and added therein. The adding circuit 6 produces a third control signal C in the form of a voltage equal to the sum of the first and second control signals A and B which are in the form of voltages, respectively.

The third control signal produced by the adding circuit 6 is applied to the variable gain amplifier 1 of the output unit 90. As explained hereinbefore, the variable gain amplifier 1 amplifies the audio input signal S at a amplification ratio determined by the third control signal C. The power amplifier 2 then amplifies the current from the variable gain amplifier 1 and drives the speaker unit 3.

The operation of the above described circuit will now be explained.

When the turn-up switch 8 is turned on, the first up-down counter 12 is set and starts to count up the clock pulses P from the clock pulse generator 7. Therefore, the counted value in the first up down counter 12 increases with time as long as the turn-up switch 8 is on. The voltage level of the first control signal A therefore increases. On the other hand, since the second up-down counter 14 is set to its count down operation mode by the turn-up signal Tu, the counted value of the second up-down counter 14 therefore decreases at the same time. In accordance with a decrease in this counted value in the second up-down counter 14, the voltage level of the output signal X of the second D-A converter decreases to cause a reduction in amplification rate of the variable gain amplifier 16.

On the other hand, when the turn-down switch 9 is turned on, the counted value of the first up-down counter 14 decreases due to the absence of the turn-up signal. Also in this state, the content of the second up down counter 14 increases to raise the voltage level of the output signal X of the second D-A converter. The amplification rate of the variable gain amplifier 16 therefore increases.

Figure 2:
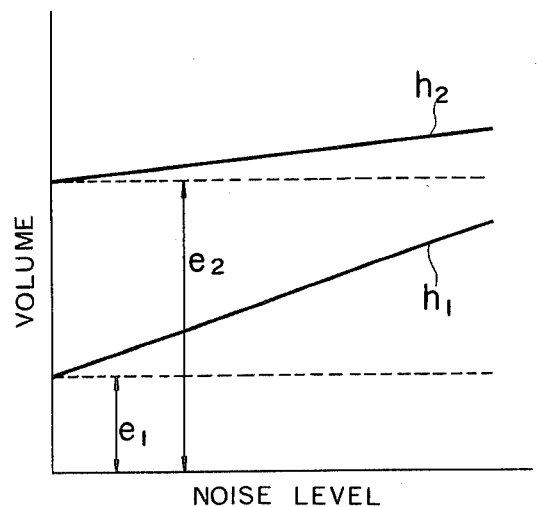
FIG. 2 is a diagram showing the control characteristics of the automatic sound level control system shown in FIG. 1.

The operation of the above control system with respect to the ambient noise level will now be given with referene to traces $h_1$ and $h_2$ shown in FIG. 2.

When the sound level selected by the listener is relatively low such as the level $e_1$ shown by the lower one of two dashed lines, the sound level is increased at a relatively higher rate with respect to the ambient noise level as shown by the trace $h_1$. On the contrary, when the sound level selected by the listener is relatively high, such as the level $e_2$ shown by the upper one of the dashed lines, the rate of the increase in the sound level with respect to the ambient noise level is relatively low, as shown by the trace $h_2$.

The above explained control characteristic of the present sound level control system, is based on the fact that the rate at which the sound level increases with the ambient noise level may suitably be decreased when the initial setting level is high, in order to keep the loudness of the sound at the level most agreeable to the listener (not too loud or not too low).

What is claimed is:

1. An automatic sound level control system for audio equipment, comprising:
   a noise level detection means for producing an ambient noise signal indicative of an ambient noise level;
   a manually operable sound level setting means for producing a sound level set signal;
   a gain control means responsive to said ambient noise signal and said sound level set signal for producing a gain control signal; and
   a variable gain amplifier for amplifying an audio input signal in response to said gain control signal in a manner that the output level of said variable gain amplifier increases with an increase in the ambient noise level and the rate at which said output level increases with an increase in ambient noise level is variable in response to said sound level set signal, wherein said rate at which said output level increases with an increase in ambient noise is relatively high when the sound level determined by said sound level set signal is low, while said rate is relatively low when said sound level determined by said sound level set signal is high.

2. An automatic sound level control system as claimed in claim 1, wherein said gain control means comprises a first control signal generator for generating a first control signal in response to said sound level set signal, a second control signal generator for generating a second control signal in response to said ambient noise signal and said sound level set signal and an adding circuit for adding said first and second control signals to produce said gain control signal.

3. An automatic sound level control system as claimed in claim 2, wherein said sound level setting means comprises a turn-up switch and a turn-down switch, each producing a turn-up signal and a turn-down signal, respectively, a clock pulse generating circuit for producing clock pulses while at least one of said turn-up signal and turn-down signal is present, and wherein said first control signal generator comprises a first up-down counter for counting said clock pulses and adapted to count up in the presence of said turn-up signal and count down in the absence of said turn-up signal, and a first digital to analog converter for converting an output signal of said first up-down counter into said first control signal, and said second control signal generator comprises a second up-down counter for counting said clock pulses and adapted to count up in the presence of said turn-down signal and count down in the absence of said turn-down signal, a second digital to analog converter for converting an output signal of said second up-down counter into an analog output signal, and an amplifier for amplifying said ambient noise signal to produce said second control signal at variable amplification factor determined by said analog output signal.

4. An automatic sound level control system for audio equipment, comprising:
   a noise level detection means for producing an ambient noise signal indicative of an ambient noise level;
   a manually operable sound level setting means for producing a sound level set signal;
   a gain control means responsive to said ambient noise signal and said sound level set signal for producing a gain control signal; and
   a variable gain amplifier for amplifying an audio input signal in response to said gain control signal in a manner that the output level of said variable gain amplifier increases with an increase in the ambient noise level and the rate at which said output level increases with the ambient noise level is in inverse proportion to the sound level set by said sound level set signal.

5. An automatic sound level control system for audio equipment, comprising:
   a noise level detection means for producing an ambient noise signal indicative of an ambient noise level;
   a manually operable sound level setting means for producing a sound level set signal, said sound level setting means comprising a turn-up switch and a turn-down switch for, respectively, producing a turn-up signal and a turn-down signal, a clock pulse generating circuit for producing clock pulses while at least one of said turn-up signal and said turn-down signal is present, said sound level set signal comprising said turn up signal, said turn down signal, and said clock pulses;

a gain control means responsive to said ambient noise signal and said sound level set signal for producing a gain control signal, said gain control means comprising a first control signal generator for a first control signal in response to said sound level set signal, a second control signal generator for generating a second control signal in response to said ambient noise signal and said sound level set signal, and an adding circuit for adding said first and second control signals to produce said gain control signal, wherein said first control signal generator comprises a first up-down counter for counting said clock pulses and adapted to count up in the presence of said turn-up signal and count down in the absence of said turn-up signal, and a first digital-to-analog converter for converting an output signal of said first up-down counter into said first control signal, and said second control signal generator comprises a second up-down counter for counting said clock pulses and adapted to count up in the presence of said turn-down signal and count down in the absence of said turn-down signal, a second digital-to-analog converter for converting said output signal of said second up-down counter into an analog output signal, and an amplifier for amplifying said ambient noise signal to produce said second control signal at a variable amplification factor determined by said analog output signal; and a variable gain amplifier for amplifying an audio input signal in response to said gain control signal in a manner such that the output level of said variable gain amplifier increases with an increase in the ambient noise level and the rate at which said output level increases with the ambient noise level is in inverse proportion to the sound level set by said sound level set signal.

6. An automatic sound level control system for audio equipment having means for generating audio input signals, comprising:

means for detecting an ambient noise level and generating an ambient noise level signal indicative of the detected ambient noise;

manually operable sound level setting means for setting a desired sound level;

gain amplifier means electrically coupled with said detecting means and said manually operable sound level setting means for varying the amplifying level of said ambient noise level signal in response to the desired sound level set by said manually operable sound level setting means, said gain amplifier means generating an amplified noise signal;

means electrically coupled with said gain amplifier means and said manually operable sound level setting means for generating a gain control signal in response to said amplified noise signal and said desired sound level; and means for amplifying the audio input signals in response to said gain control signal.

7. An automatic sound level control system for audio equipment having means for generating audio input signals, comprising:

means for detecting an ambient noise level and generating an ambient noise level signal indicative of the detected ambient noise;

manually operable sound level setting means for setting a desired sound level;

gain amplifier means electrically coupled with said detecting means and said manually operable sound level setting means for amplifying said ambient noise level signal at a rate which is variable in response to the desired sound level set by said manually operable sound level setting means, said gain amplifier means generating an amplified noise signal;

means electrically coupled with said gain amplifier means and said manually operable sound level setting means for generating a gain control signal in response to said amplified noise signal and said desired sound level; and means for amplifying the audio input signal in response to said gain control signal.

8. An automatic sound level control method for audio equipment having means for generating audio input signals, comprising the steps of:

detecting an ambient noise level and generating an ambient noise level signal indicative of the detected ambient noise;

detecting a desired manually set sound level;

varying the amplifying level of said ambient noise level signal at a rate which varies as the manually set sound level rises and generating an amplified noise signal;

generating a gain control signal in response to said amplified noise signal and said desired sound level; and amplifying the audio input signals in response to said gain control signal.

* * * * *